United States Patent [19]

Bennett, Jr. et al.

[11] 4,099,125
[45] Jul. 4, 1978

[54] FREQUENCY ERROR CORRECTION CIRCUIT

[75] Inventors: Robert McKay Bennett, Jr., West Dundee; James Leslie Osborn, Arlington Heights, both of Ill.

[73] Assignee: Motorola, Inc., Schaumburg, Ill.

[21] Appl. No.: 699,020

[22] Filed: Jun. 23, 1976

[51] Int. Cl.² .................. H04B 1/26; H03B 3/06
[52] U.S. Cl. .................. 325/419; 325/420; 329/122; 331/17
[58] Field of Search .................. 325/418–423, 325/430, 433, 435, 17, 63, 346; 331/17, 18, 25; 329/122, 123

[56] References Cited

U.S. PATENT DOCUMENTS

| | | | |
|---|---|---|---|
| 3,223,943 | 12/1965 | Dumaire et al. | 331/17 |
| 3,573,649 | 4/1971 | West | 331/17 |
| 3,903,482 | 9/1975 | Pausini et al. | 331/17 |
| 3,936,753 | 2/1976 | Clark | 325/420 |

*Primary Examiner*—Robert L. Griffin
*Assistant Examiner*—Marc E. Bookbinder
*Attorney, Agent, or Firm*—Sang Ki Lee; James W. Gillman

[57] ABSTRACT

A circuit for correcting frequency errors in an incoming signal that includes a particular frequency signal. The circuit includes dual phase locked loop circuitry for providing a frequency feedback control, detecting circuitry for detecting the presence of the particular coded signal and generating a hold signal, and a sample and hold circuitry disposed in the feedback path of the phase locked loop circuitry and responsive to the hold signal for setting the feedback control at a particular value to provide an optimal frequency error correction for the particular frequency signal and for holding the feedback control at the particular value for the entire spectrum of the incoming signal, whereby the frequency feedback control set for the particular frequency tone is used for the entire spectrum of the incoming signal to minimize the error in the output frequencies of the circuit.

8 Claims, 1 Drawing Figure

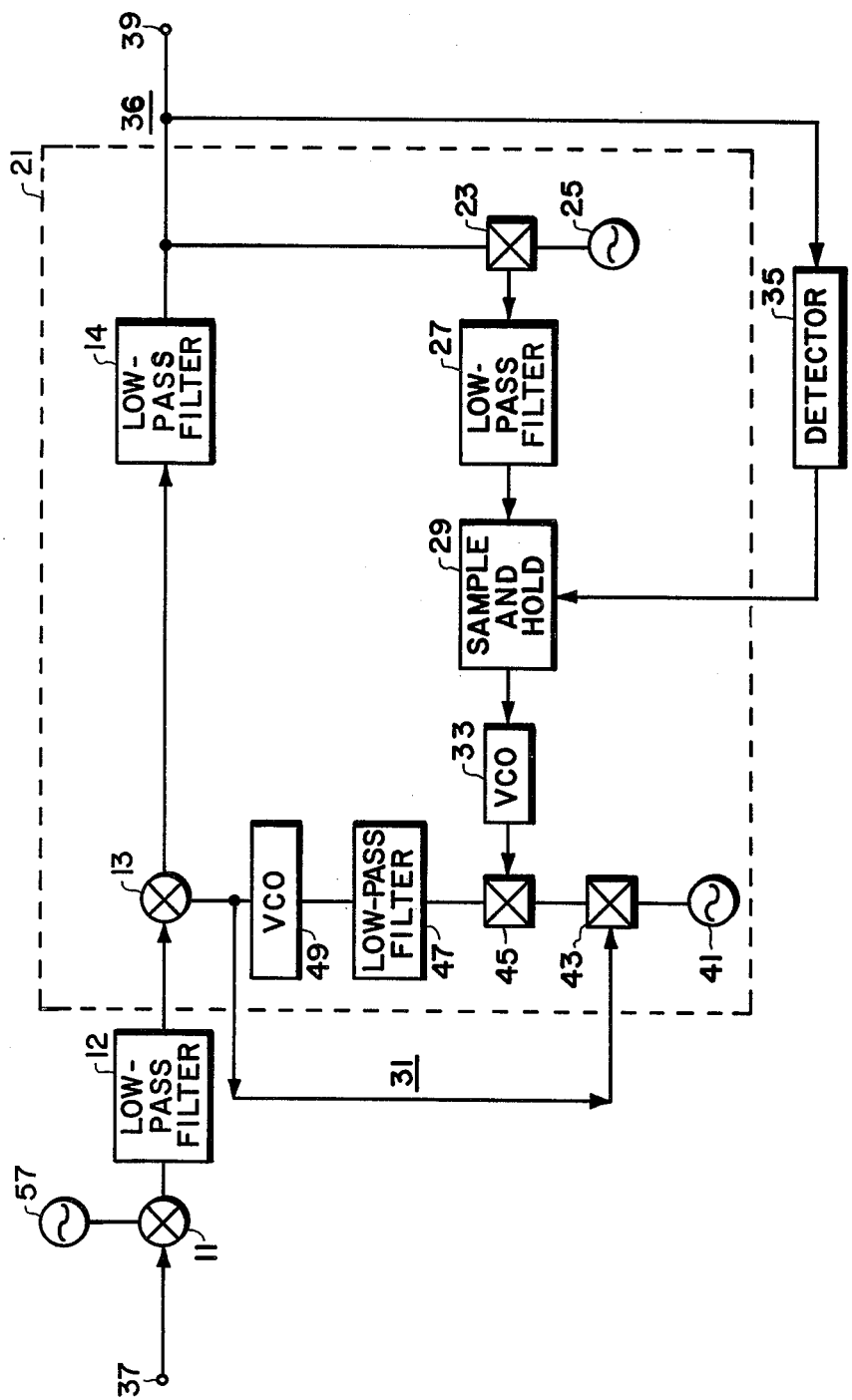

FREQUENCY ERROR CORRECTION CIRCUIT

FIELD OF THE INVENTION

This invention relates to a frequency error correction circuit and in particular an improved frequency error correction circuit that utilizes dual phase locked loop circuitry for providing the correction.

BACKGROUND OF THE INVENTION

Phase locked loop circuitry is a form of frequency feedback control circuitry used extensively to receive and track an incoming signal that may be imbedded in a high ambient noise and that may have been drifting in frequency caused by the transmission medium. Generally the phase locked loop circuitry includes a forward path which includes a frequency modulator for modulating an incoming signal and a low pass filter for filtering out the high frequency sidebands and recovering the transmitted signal and a feedback path with a voltage controlled oscillator to provide the injection or local oscillator frequency to the modulator and frequency error correction.

It is also found that the VCO tracking error in frequency increases as the frequency output of the VCO increases. Also the wider the spectrum of the incoming signals, the greater the VCO error tends to be. The accuracy of signal detection and correction is found to fluctuate widely when the incoming signals are composed of signals of different frequency characteristics, such as, is the case with a voice band signal composite of voice, data and a particular inband tone signal encountered in telecommunication systems.

SUMMARY OF THE INVENTION

It is an object of the present invention to provide an improved frequency error correction circuit.

It is yet another object of the present invention to overcome the aforementioned and other problems and shortcomings in the frequency error correction circuit.

The aforementioned and other objects are attained and the aforementioned and other problems are overcome in accordance with the present invention by providing a frequency error correction circuit that includes a phase locked loop circuit for providing a frequency feedback control to a particular frequency incoming signal, detection means for detecting the presence of a particular coded signal in the incoming signal and generating a hold signal and holding means disposed in the feedback path of the phase locked loop circuitry and responsive to the hold signal for setting the feedback control at a particular value for the particular frequency signal and holding the same value for the entire spectrum of the incoming signal.

It is another feature of the present correction circuit to use a dual phase locked loop circuit in order to minimize thermal drift and other inherent instability of the phase locked loop when the loop is opened for certain purposes.

It is yet another feature of the present invention to use a phase locked translation loop for generating the injection frequency of the phase locked loop in response to the error signal output of the holding means.

It is still another feature of the invention to utilize, for the holding means, an analog-to-digital conversion circuit, storage circuit, and digital-to-analog conversion circuit or analog sample and hold circuit for holding the correction value established to provide an optimal correction for the particular frequency for the entire spectrum of incoming signal.

The foregoing and other features of the present invention will be more clearly apprehended from the following detailed description of an illustrative embodiment of the present invention in connection with the accompanying drawings.

DETAILED DESCRIPTION

In a telecommunications system a code signal of a particular frequency in the voice band is used often to provide certain signalling information. For example, telecommunication transmission systems often carry a composite of signals that may include not only the voice signal but also digital data signals as well as tone signals of particular frequencies. Also, it is known that switched paths in telecommunication systems tend to interpose different amounts of errors to the signals transmitted therethrough. The errors are often in the form of frequency and tend to vary from switch path to switch path.

In such environment, phase locked loop circuitry is often utilized to track the incoming signal of a particular frequency inserted amongst bursts of data or the like information or voice information being recieved.

In accordance with the present invention, a dual phase locked loop circuitry is utilized not only to track the signal of a particular frequency but also to derive frequency error correction signal for the particular frequency and use the error correction signal so derived for correcting the frequency errors in the particular frequency signal as well as other spectrums of frequencies of the incoming signal.

Broadly stated, in the present error correction circuitry, the received tone signal having a known transmitted frequency that has been subject to transmission frequency error is modulated upward in frequency utilizing a fixed frequency oscillator output. A dual phase locked loop circuit is then used to supply an injection frequency that modulates the upwardly modulated signal, this time downward in frequency. The resulting signal output is then compared to a reference frequency to derive an error voltage. The error voltage is utilized to control the loop injection frequency. In particular, the error voltage is used to control the injection frequency and force the error to approach zero.

In accordance with an aspect of the present invention, the phase locked loop circuitry is provided with means to fix an injection frequency at the last value set for the correction of the phase locked loop upon detection of a particular frequency signal and the injection frequency so obtained is used for the entire spectrum of frequencies of the incoming signal. Advantageously, this minimizes the tracking error that the phase locked loop circuitry would otherwise experience if it were allowed to follow the wide range of variations in the frequency of the incoming signal.

The aforementioned principle of the present invention is illustrated in an embodiment in the form of functional schematic circuit shown in the accompanying drawing. Referring to the drawing the correction circuitry includes a first modulator 11, a first low pass filter 12, a second modulator 13, a second low pass filter 14 in the forward path for receiving and processing the incoming signal that includes a signal of the particular frequency.

As illustrated, the correction circuit includes a phase locked loop circuitry 21 which is designed in a dual phase locked loop configuration for operation in dual mode as will be explained in detail hereinafter. The phase locked loop 21 includes the second demodulator 13 and the second low pass filter 14 in its forward path and in its feedback path there are provided phase detectors, low pass filters, voltage controlled oscillators and reference signal generators operatively coupled to provide an injection frequency to the second modulator for correcting the frequency error, as explained in detail hereinbelow.

In particular, the feedback path includes a phase detector 23 that compares the output of the forward path with an output of a reference signal from a reference oscillator 25. The phase detector generates an error signal which is applied to a low pass filter 27. Filter 27, in turn, generates an output in response to the output of the phase detector 23. The output of the filter 27 indicates the error level detected by the phase detector 23. The output of the low pass filter 27 is then applied to a sample and hold circuit 29 of a conventional design adapted to respond to the error signal from the low pass filter 27 and to an external hold signal for holding the output thereof to a level established by the error signal output of the filter 27 when the hold signal is received. The output of the sample and hold circuitry is then applied to a low range voltage controlled oscillator 33 of a conventional type which generates an AC output signal the frequency of which is proportional to the amplitude of the output of the sample and hold circuitry.

In order to provide the hold signal to the sample and hold circuitry 29, a suitable detector 35 is interposed between the output 36 of the error correction circuitry and the sample and hold circuit 29. The detector can be a conventional type designed to detect the phase reversal or a phase shift keyed for detecting the presence of a particular known coded signal. Upon detection of the particular code in the output 36, the detector 35 provides a hold signal to the sample and hold circuitry 29 at a particular value when the particular coded signal is detected. The sample and hold circuitry is of a design that maintains its output at the particular level so long as the hold signal is kept on. This is accomplished by using an analog-to-digital conversion circuit to convert the output of the filter 27 into a digital value, a storage circuit that stores the output of the conversion circuit and a digital-to-analog conversion circuit that converts the stored signal into an analog signal and apply the same to VCO 33. When the hold signal is turned off, which may occur, at the end of a message transmission, the sample and hold circuitry reverts back to its normal mode of operation, i.e., its output tracks its input coming from the low pass filter 27.

In accordance with a feature of the present invention, the error correction circuit includes a phase locked translation loop 31 which includes a high frequency reference signal generator 41 which supplies a signal of a particular frequency, a phase detector 43, a phase detector 45, a low pass filter 47, a voltage controlled oscillator 49 and a feedback path 51 for feeding back the output of the VCO 49 to the phase detector 43. Various elements of the phase locked translation loop mentioned above are operatively connected to generate the injection frequency applied to the modulator 13 for correcting the frequency error in the received signal as follows.

In accordance with the present invention, the dual phase locked loop circuitry is used to set the injection frequency or VCO signal for the particular frequency signal to provide optimal correction to the particular frequency signal and to hold the correction at that level for the entire duration of the incoming message signal of different frequencies. The time duration of the incoming message signal is marked by the aforementioned particular coded signal. This minimizes the tracking error that the correction circuitry would otherwise experience if the injection frequency applied to the modulator 13 is allowed to vary in proportion to the wide variation of the incoming data or message signal frequency. This would be the case, if the phase locked loop circuitry is allowed to continuously track the incoming data or message signal frequency as the conventional phase locked loop circuitry is designed to do.

The operation of the illustrative correction circuitry will now be provided in terms of a particular frequency signal and circuit parameters such as the modulating frequencies and reference frequency signals for the ease of illustrating the present invention. Expressed in terms of the sequence of transmission generally involved, a signal of particular frequency is transmitted and the correction circuit detects and tracks this signal and a coded signal is transmitted to signify the start of the transmission of a message signal. Upon detection of the coded signal, the correction circuit locks on to a particular error correction level. When the transmission of the message is complete, a coded signal is sent again and this is detected by the detector and the detector puts the feedback loop in the normal track mode. In specific terms, a tone signal of a particular frequency may be 1500 hertz tone signal, disposed in the intermediate the conventional telephone line frequency bandwidths of three kilohertz. Thus an incoming signal applied to the input 37 to the correction circuitry may include the tone signal of 1.5 kilohertz in a sequence of message signals that may include bursts of voice signals, digital data or other type of information or any combination of them, in the course of transmission these signals have often been subjected to frequency errors by the transmission medium.

There is also provided a frequency signal generator 57 which provides 8.1 kilohertz for upwardly modulating the incoming tone signal. Advantageously, for the oscillators 25 and 41 of the phase locked loop circuitry, highly stable crystal oscillators are used to provide 1.5 and 8.1 kilohertz reference signals respectively.

In operation, the 1.5 kilohertz signal is balance modulated utilizing the stable 8.1 kilohertz output from the oscillator 57. The modulator 11 provides a balanced modulation output of double sidebands, that is, upper sideband and lower sideband signal with reference to 8.1 kilohertz, namely, 8.1 kilohertz minus 1.5 kilohertz for the lower sideband and 8.1 kilohertz plus 1.5 kilohertz for the upper sideband. The low pass filter 12 is preferably of a conventional elliptical type that has a cutoff frequency of 8.1 kilohertz. So it filters out the upper sideband and transmits therethrough the lower sideband signal. Thus, in effect, the modulator provides upward modulation in frequency using the fixed frequency oscillator 57 output. The output of the low pass filter contains a 6.6 kilohertz low side band signal. This side band signal is applied to the modulator 13 which modulates the tone signal downward using the injection frequency of 8.1 kilohertz from the VCO 49.

The modulator 13 is also of the balanced modulator type that provides an output having the upper and the lower sideband signal centered about the injection frequency signal applied thereto from the voltage controlled oscillator 49. As will be explained, with no error, the VCO 49 is set to provide 8.1 kilohertz. So the output of modulator 13 is 8.1 kilohertz minus 6.6 or 1.5 kilohertz for the lower sideband and 8.1 plus 6.6 kilohertz or 14.7 kilohertz for the upper sideband. The output of the modulator 13 is processed through the low pass filter 27 which is preferably of a conventional low pass filter of a known type. Filter 27 filters out the upper sideband and passes the lower sideband 1.5 kilohertz signal. The output of the low pass filter 14 is applied to any utilization means such as a speaker or other utilization means via its output path 39.

As an aside, hereinabove incoming signal of a particular tone frequency of 1.5 kilohertz is used to illustrate the incoming tone signal for which correction is to be made. But this is for convenience of description. In fact, the signal is in the form of 1.5 kilohertz $\pm \epsilon$ where $\epsilon$ represents the frequency error introduced in the signal during the transmission over the transmission medium. It is the aim of the correction circuit to correct this $\epsilon$ in the received signal. So it is to be understood that, whenever incoming frequency of 1.5 kilohertz is mentioned, it is meant to be nominal and in fact it is intended to mean 1.5 kilohertz $\pm \epsilon$ error frequency.

In a similar vein, for ease of description, it is stated hereinabove that VCO 49 provides 8.1 kilohertz, but in fact it provides 8 kilohertz plus $\Delta f$, where $\Delta f$ varies upward of 70 to 125 hertz depending upon the error rate. As the $\Delta f$ approaches $100 \pm \epsilon$ hertz, the difference between the output of the correction circuit and the output of the reference oscillator 25 approaches zero. So nominal reference to the VCO 49 output as 8.1 kilohertz merely refers to its nominal output. At this point, the output of the detector 23 approaches a steady state and this defines zero error condition.

The present error correction circuitry relies on a dual phase locked loop configuration to provide the VCO injection frequency to the modulator 13 in the forward path of the phase locked loop to correct the frequency error. The injection frequency is obtained as follows. The output of the low pass filter 14 is compared in frequency and phase to a stable reference signal, for example, in the specific case here, 1.5 kilohertz from the oscillator 25. The error signal provided by the phase detector 23 is applied through the low pass filter 27 to provide an error signal and thence to the sample and hold circuitry 29. The sample and hold circuitry 29 is in turn used to control the VCO 33 which is advantageously designed to generate a low frequency of 75 to 125 hertz depending on the sample and hold circuit output.

The low frequency VCO 33 can be held constant for a length of time by using a sample and hold circuitry of a conventional analog type using a capacitive storage means. Analog sample and hold circuitry is susceptible, however, to a typical decay over a period of time because the capacitive storage means tends to leak and as a practical matter the leakage is hard to prevent.

Preferably, therefore, it is better to use a network that includes an analog-to-digital, storage and digital-to-analog type of a conventional circuit for the sample and hold circuitry. The hold signal holds the sample and hold circuitry to an error signal of the particular level for the particular frequency, namely, 1500 hertz so that the error, i.e., the difference between the output of the error correction circuit at the output and the output of the low frequency reference signal source 25 approaches zero. Advantageously the sample and hold circuitry 29 will hold the VCO 33 so that it will hold its output to a particular level so long as the hold signal applied to the sample and hold circuitry 29 stays.

The sample and hold circuit output is adjusted to vary the output of the low range VCO 33, between 75 to 125 hertz, as the error signal output of the low pass filter 27 varies. The low range VCO output is then used to introduce an offset into the phase locked translation loop 37 to control the VCO 49 output. The phase locked translation loop or the second loop is a fixed loop and is not designed to open and uses a crystal oscillator for the oscillator 41 to give the correction circuit greater stability. The injection frequency from the output of the VCO 49 is equal to the crystal oscillator frequency plus the low range VCO frequency.

The low range output frequency of VCO 33 is dependent upon the error in the output frequency of the error circuit at the output of low pass filter 14 in the forward path as detected by the phase detector 23. The VCO 33 adjusts the offset of the injection loop until this difference approaches zero.

The low pass filter 47 converts the error signal output provided by the phase detector 45 and applies resultant signal to the VCO 49 to control the VCO output. In addition, the VCO output is also fed back to the phase detector 43. In the specific example given above, the phase detector 43 compares the output of the injection oscillator, VCO 49, which is in the range of 8.1 kilohertz when the error approaches zero with the output of the oscillator 41 set at 8.0 kilohertz. So, the difference frequency of 100 hertz is provided by the phase detector 43. This is applied to the phase detector 45 which will provide an output which is the difference between the output of the phase detector 43 in the 100 hertz range and the output of VCO 33 which is in the range of 75 to 125 hertz.

As the error approaches zero, the difference frequency provided by the phase detector 45 is essentially measured in terms of the output of VCO 33. By setting the VCO 33 output to about 100 hertz when the error is zero, the detector 45 output approaches its steady state. Under this condition the low pass filter 47 is adjusted to cause the VCO 49 to provide the reference or injection frequency signal of 8.1 kilohertz to the modulator 13. In short, the low range VCO frequency output of the VCO 33 is used to adjust the injection frequency output to 8.1 kilohertz when the difference between the output of the phase detector 43 and VCO 33 approaches zero.

Once the sample and hold circuitry is held in the "hold" state, by the hold signal from the detector 35, the output of the sample and hold circuit 29 is held at a fixed level established at the time hold signal is applied thereto. Thereafter, during the periods of data or voice or other bursts of information, the correction circuitry is put into a hold mode, by the hold signal. When this takes place, the feedback path is opened up in effect by the sample and hold circuitry 29 and VCO 33, output stays fixed and thereby hold the offset introduced to the injection VCO 49 at the last predata or premessage signal values, at which the VCO 49 is set before the feedback path is opened up.

Various modifications may be made to the detection circuitry and the sample and hold circuitry to meet particular needs. For example, suppose the particular frequency signal is used in coded form to signify the beginning and the ending of a message signal and if it is desired to operate the sample and hold only for that duration, then the detector can be readily modified to send start holding and stop holding signals to the sample and hold circuitry. The sample and hold circuitry may in turn, be designed to recognize start and end signals of the holding signal and operate to provide a fixed output only for that duration to the VCO 33 and otherwise revert back to continuous closed loop mode operation.

An advantage of the present circuitry is in the increased stability obtained through the use of the phase locked loop circuitry and, in particular, through the use of a phase locked translation loop 31. As noted before, the translation loop is controlled by a highly stable crystal oscillator 41 that provides highly stable output. The output of the phase detector 43 is a frequency signal equal to the difference between the two input frequencies, namely the 8 kilohertz source and the output of VCO 49 which is nominally 8.1 kilohertz. This difference frequency which ranges around 100 hertz is applied to the phase detector 45. The detector 45 compares the output of the VCO 33 in the range of 75 to 125 hertz to the output of the detector 43. In turn, the detector 45 generates an output indicative of the difference between the two inputs thereto. This output varies in proportion to the difference in the two inputs and is applied to the low pass filter 47. In turn, the output of the filter 47 in the filter, controls the VCO 49 output frequency. The VCO output frequency then approaches, the frequency sum of the output of oscillator 41 and VCO 33.

The crystal oscillator has an inherently high stability and is designed to provide substantially high frequency output. But the output frequency range of VCO 33 is relatively low, compared to the high frequency output of the oscillator 41. So the effect of the relative instabilities of VCO 33 output to the translation loop 31 is minimized.

Various other modifications may be made to the present invention by a person of ordinary skill without departing from the spirit and scope thereof.

Thus, for example, whereas in the present embodiment it is shown that an incoming signal is up modulated and then down modulated and subjected to a correction by the phase locked loop circuitry with an additional means for providing the frequency error corrections, other embodiments can be used. For example, if the incoming signal has already been up modulated, then the up modulated signal need not be up modulated again. Instead it can be down modulated directly to obtain its lower sideband signal and the lower sideband signal is then processed through the present inventive phase locked loop circuitry for obtaining the frequency error correction.

It is also shown in the present embodiment that the up modulated signal is filtered through a low pass filter and down modulated and filtered again through another low pass filter. But if the incoming frequency signal is the kind that has been shifted into a high frequency band, for example, 30-34 kilohertz range, then a bandpass, not a low pass filter should be used. Also, whereas in the present embodiment the detector is shown to detect the incoming signal from the output of the correction circuit, it need not be so limited. Thus, the detector could be connected to the input of the present error circuitry to detect the incoming signal and provide the hold signal, although preferably it is better to connect the detector to the output of the phase locked loop and derive the hold signal because the output of the error correction circuit is already stablized and is more reliable whereas the incoming signal is not yet free of extraneous noise signal components and is not as reliable.

What is claimed is:

1. A circuit for correcting frequency errors in incoming signals of different frequencies within a bandwidth, the incoming signal including a particular frequency signal, message signal and a coded signal, wherein said incoming signal has been subjected to frequency errors, said circuit comprising:

first modulator and first filter operatively coupled to modulate the incoming signal and provide a single side band modulated signal output;

means for detecting the coded signal from the incoming signal and generating a hold signal; and a phase locked loop circuit having a forward and feedback path for modulating and deriving the incoming signal, said forward path including said first modulator and said first filter and said feedback path including detecting means for deriving an error signal from the output of said first filter, means for generating and applying an injection frequency signal to said first modulator, and sample and hold means interposed between said error detecting means and injection frequency generating means and responsive to the hold signal and the error signal output of said error detecting means for enabling said injection frequency signal generating means to establish the frequency of the injection frequency signal.

2. The circuit according to claim 1, wherein said error signal detecting means includes first reference frequency signal source, a first phase detector for comparing the output of said first low pass filter with the first reference signal from said first reference frequency signal source for providing an output signal, a second low pass filter responsive to the output signal for deriving the error signal and applying the error signal to said sample and hold means.

3. The circuit according to claim 2, wherein said sample and hold circuitry includes an analog-to-digital conversion circuit, storage circuit and digital-to-analog conversion circuit responsive to the error signal and the hold signal for providing an output DC signal the amplitude of which is proportional to the error signal amplitude from the error detecting means at the time the hold signal is received, and a first voltage controlled oscillator for providing a low range output frequency signal in response to the output of said sample and hold circuitry.

4. The circuit according to claim 3, wherein said injection frequency generating means comprises a phase locked translation loop having a second reference frequency signal source, second and third phase detectors, third low pass filter, and a second voltage controlled oscillator operatively connected in series in a forward path and a feedback path connecting the output of said second voltage controlled oscillator to said second phase detector, wherein said phase locked translation loop operates in response to the output of said first voltage controlled oscillator and second reference frequency signal from said second reference frequency signal source for enabling said second voltage controlled oscillator to generate and apply the injection frequency signal to said first modulator.

5. The circuit according to claim 4, wherein said third phase detector compares the output of said first voltage controlled oscillator and said second phase detector for providing a phase difference signal to said third low pass filter and wherein said third low pass filter is responsive to said phase difference signal for applying a DC signal to said second voltage controlled oscillator for controlling its output injection frequency.

6. A circuit for correcting frequency errors in an incoming signal having a composite of frequency spectrum including a particular frequency signal, coded signal and message signal, said circuit comprising:
   a phase locked loop circuitry for providing a feedback control signal the incoming signal,
   detection means for detecting the presence of the coded signal and generating a hold signal, and
   means disposed in the feedback path of said phase locked loop circuitry responsive to the hold signal for setting the feedback control at a particular level to correct the frequency error for the particular frequency signal and maintain the feedback control signal at the same level for the entire spectrum of the incoming signal as long as the hold signal is present.

7. The circuit according to claim 6, wherein said incoming signal is in the form of a frequency modulated signal, and wherein said phase locked loop circuitry includes a forward path having means for demodulating the incoming signal to obtain a demodulated signal and said feedback path having means for deriving an error signal for the particular frequency signal, said feedback control signal setting means being responsive to the error signal and the hold signal for providing said feedback control signal and a translation loop responsive to the feedback control signal and generating an injection frequency signal to the forward path to correct the frequency error in the demodulated signal.

8. The circuit according to claim 7, wherein said error signal responsive means includes an analog-to-digital conversion circuit, storage circuit, and a digital-to-analog conversion circuit for stablizing the feedback control signal of the phase locked loop circuitry.

* * * * *